US010868199B2

(12) United States Patent
Marzaki

(10) Patent No.: US 10,868,199 B2
(45) Date of Patent: Dec. 15, 2020

(54) STANDARD INTEGRATED CELL WITH CAPACITIVE DECOUPLING STRUCTURE

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/259,424

(22) Filed: Jan. 28, 2019

(65) Prior Publication Data

US 2019/0237589 A1    Aug. 1, 2019

(30) Foreign Application Priority Data

Jan. 30, 2018    (FR) ...................................... 18 50725

(51) Int. Cl.
| | |
|---|---|
| *H01L 29/94* | (2006.01) |
| *H01L 29/66* | (2006.01) |
| *H01L 27/06* | (2006.01) |
| *H01L 27/118* | (2006.01) |
| *H01L 27/02* | (2006.01) |

(52) U.S. Cl.
CPC ........ *H01L 29/945* (2013.01); *H01L 27/0207* (2013.01); *H01L 27/0629* (2013.01); *H01L 27/11807* (2013.01); *H01L 29/66181* (2013.01)

(58) Field of Classification Search
CPC ........................ H01L 29/945; H01L 29/66181
USPC .................................................. 257/301, 532
See application file for complete search history.

(56) References Cited

U.S. PATENT DOCUMENTS

| | | | |
|---|---|---|---|
| 8,609,486 B1 | 12/2013 | Smeys et al. | |
| 10,276,554 B1 * | 4/2019 | Chen ................... | H01L 29/0649 |
| 2005/0280031 A1 * | 12/2005 | Yano ................... | H01L 27/0207 257/202 |
| 2011/0169065 A1 * | 7/2011 | Cheng ............... | H01L 29/66181 257/301 |
| 2015/0061083 A1 | 3/2015 | Yeh | |
| 2017/0250197 A1 * | 8/2017 | Shimbo ............... | H01L 27/0629 |

FOREIGN PATENT DOCUMENTS

WO    2007005141 A1    1/2007

OTHER PUBLICATIONS

INPI Search Report and Written Opinion for FR 1850725 dated Sep. 26, 2018 (8 pages).

* cited by examiner

*Primary Examiner* — David Vu
*Assistant Examiner* — Brandon C Fox
(74) *Attorney, Agent, or Firm* — Crowe & Dunlevy

(57) ABSTRACT

A standard integrated cell includes a semiconductor region with a functional domain for logic circuits including a transistor and an adjacent continuity domain that extends out to an edge of the standard integrated cell. The edge is configured to be adjacent to another continuity domain of another standard integrated cell. The standard integrated cell further includes a capacitive element. This capacitive element may be housed in the continuity domain, for example at or near the edge. Alternatively, the capacitive element may be housed at a location which extends around a substrate region of the transistor.

25 Claims, 5 Drawing Sheets

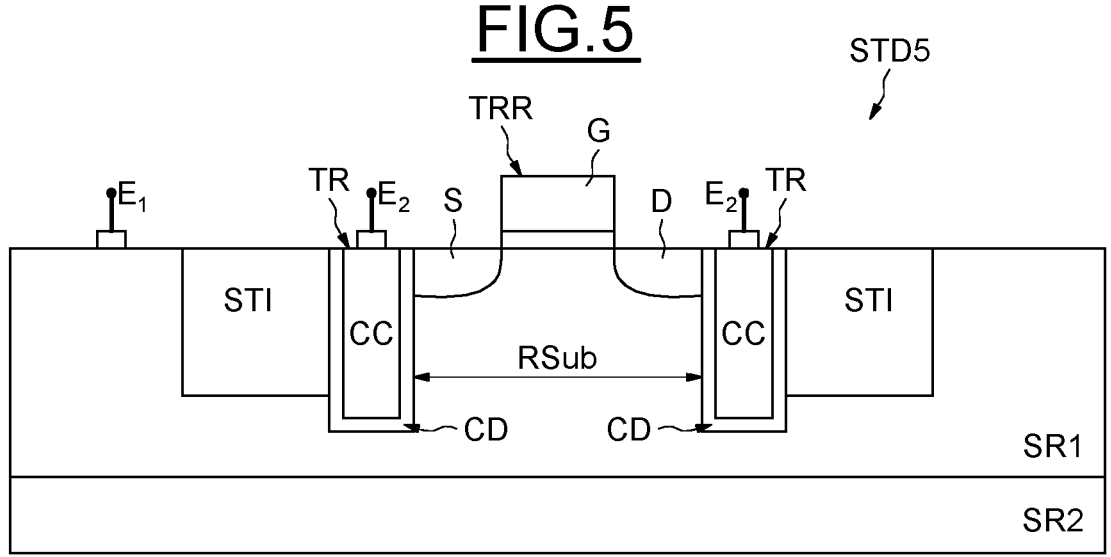
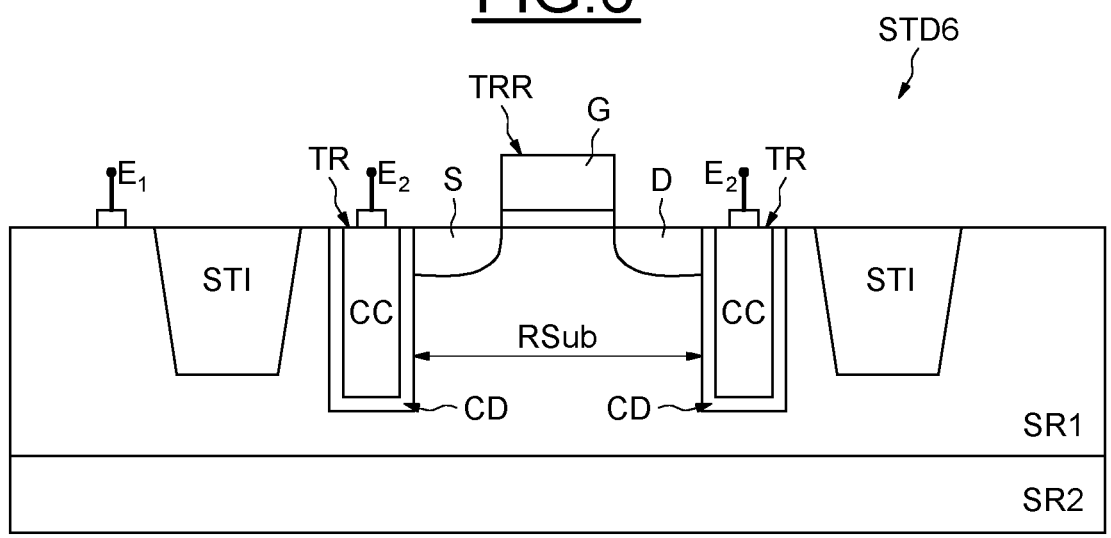

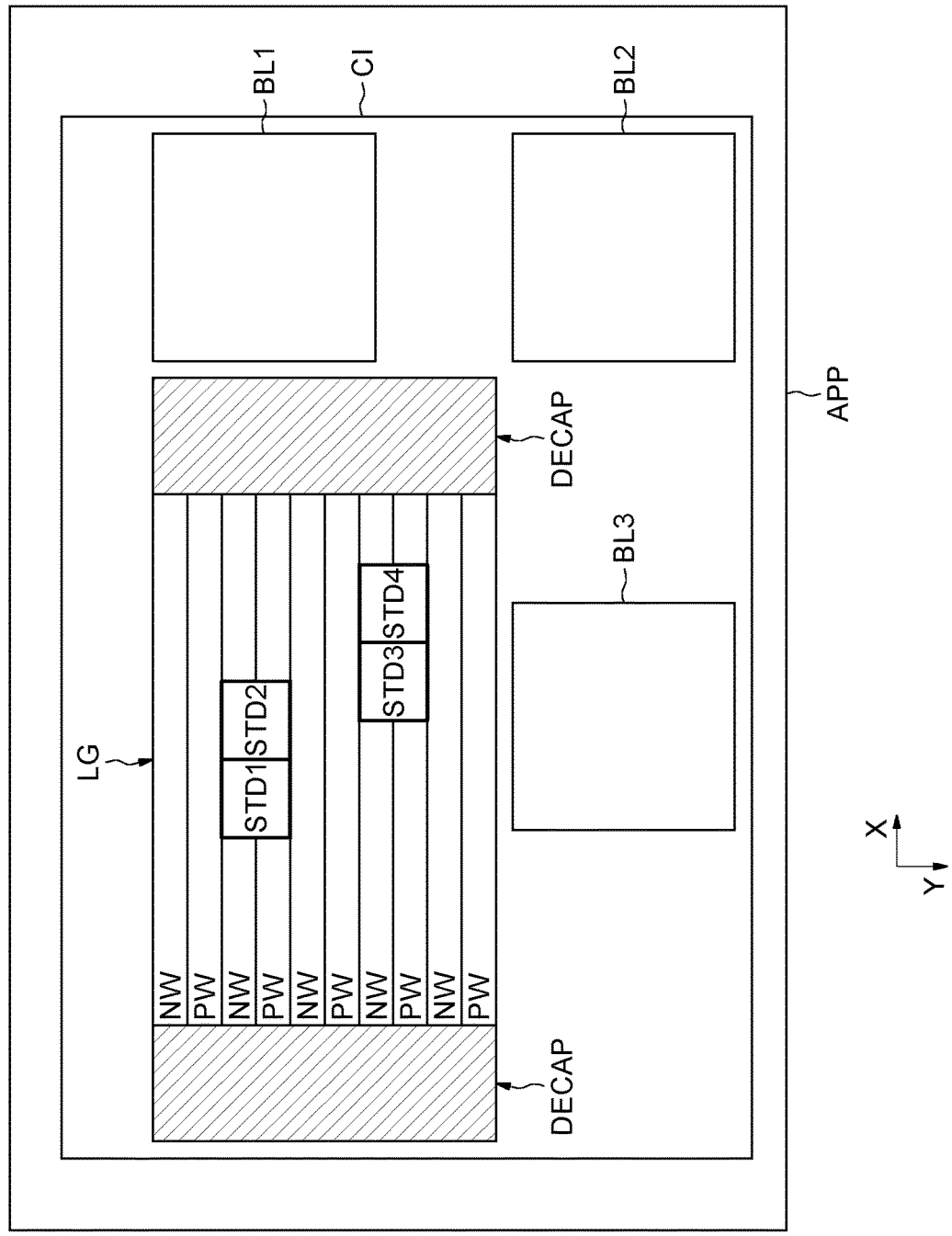

STANDARD INTEGRATED CELL WITH CAPACITIVE DECOUPLING STRUCTURE

PRIORITY CLAIM

This application claims the priority benefit of French Application for Patent No. 1850725, filed on Jan. 30, 2018, the content of which is hereby incorporated by reference in its entirety to the maximum extent allowable by law.

TECHNICAL FIELD

The invention relates to integrated circuits and, more particularly, to standard cells such as, for example, input/output cells.

BACKGROUND

Standard cells are generally produced using CMOS technology and are designed and optimized in advance so as, for example, to be stored in standard cell libraries. Standard cells may have logic functions. Thus, the designer of an integrated circuit may make use of these standard cells to position them and interconnect them according to the architecture of an integrated circuit to be designed.

FIG. 1 shows a view from above of a logic part LG of an integrated circuit. The logic parts LG of an integrated circuit typically include n-type semiconductor wells alternating with p-type semiconductor wells.

The n-type semiconductor wells and p-type semiconductor wells may be arranged in bands traversing the logic part in a first direction (in a direction X), alternating with one another in a second direction that is orthogonal to the first direction (in a direction Y, perpendicular to the direction X). This makes it possible, in particular, to produce standard cells in which logic gates produced using a complementary technology (CMOS) are formed.

In the logic parts LG of integrated circuits, current spikes may bring about very brief drops in voltage which disrupt the operation of components. These drops in voltage become increasingly disruptive as the supply voltage gets lower.

Decoupling capacitors DECAP connected between ground and the power supply filter out such sudden variations in the supply voltage. Consequently, capacitive decoupling elements produced using MOS technology, of gate-channel capacitor (channelcap) type, occupy a dedicated space located on the edge of the logic part LG.

The volume of the space dedicated to the decoupling capacitors DECAP is substantial.

For architectural reasons, the logic part LG sometimes includes empty spaces in which no logic gates are formed. Filler capacitive cells FC, which are formed in these empty spaces, have been proposed. This allows the empty spaces, if present, of an integrated circuit design to be gainfully used.

However, it is always desirable to increase the capacitive value of the capacitive decoupling elements, preferably without increasing the footprint.

SUMMARY

According to one embodiment, a standard cell is provided, which cell is advantageously produced using CMOS technology, for example using 40 nanometer CMOS technology, or else using smaller (for example smaller than or equal to 28 nm, in particular 20 nm) or larger (for example 55 nm or 90 nm) technology, comprising in particular capacitive elements allowing the overall capacitive value of the decoupling capacitors to be increased, without increasing the space taken up by the integrated circuit.

According to one aspect, a standard integrated cell is thus provided, comprising:
 at least one semiconductor region including at least one functional domain containing at least one transistor, for example a MOS transistor;
 at least one domain, referred to as a continuity domain, that is intended to be adjacent to at least one other continuity domain of at least one other standard integrated cell;
 at least one capacitive element housed in said at least one continuity domain and/or around a substrate region of said at least one transistor.

Stated otherwise, capacitive elements are housed in "available" spaces within a standard cell.

The term "available space" is understood to mean, for example, a space which, in a standard cell having a completed functional architecture, is capable of accommodating at least one capacitive element, without changing or negatively affecting said function of the standard cell.

Thus, each standard cell participates in increasing the overall capacitive value of a decoupling capacitor.

According to one embodiment, said capacitive element housed in said continuity domain includes a capacitive trench portion that is located on the edge of said continuity domain, and is intended to form a complete capacitive trench with another capacitive element located on the edge of said other continuity domain.

Since the available space in the continuity domain may be relatively small, this embodiment allows a complete capacitive trench to be formed by combining two capacitive trench portions belonging to two standard cells that are adjacent to one another.

According to one embodiment, said capacitive trench portion comprises a vertical conductive region and a dielectric wall separating said conductive region from said semiconductor region on the bottom and on one side of the conductive region.

Such a vertical configuration makes it possible to provide an advantageous capacitive value per unit area.

According to one embodiment, said at least one capacitive element housed in the continuity domain includes at least one capacitive trench including a vertical conductive region enveloped by a dielectric wall.

This embodiment corresponds to a configuration in which the available space in the continuity domain is sufficient to accommodate at least one complete capacitive trench, and is in particular advantageous in terms of added capacitive value per standard cell.

According to one embodiment, said transistor comprises a substrate region delimited by insulating regions, and the capacitive element housed around the substrate region of the transistor surrounds said substrate region, within said insulating regions.

According to one embodiment, said capacitive element housed around said substrate region comprises a capacitive trench including a vertical conductive region enveloped by a dielectric wall.

According to one embodiment, said capacitive element is located at a distance from said insulating regions.

This embodiment has the advantage of maximizing the capacitive area of the capacitive element, which is advantageous in terms of added capacitive value per standard cell.

According to one embodiment, said capacitive element is located in contact with said insulating regions.

These embodiments have, in particular, the advantage of minimizing the footprint of the capacitive element within a standard cell.

An integrated circuit including multiple standard cells such as defined above is also provided.

An electronic device, such as a mobile telephone or an on-board computer of a vehicle, including an integrated circuit such as defined above is also provided.

BRIEF DESCRIPTION OF THE DRAWINGS

Other advantages and features of the invention will become apparent upon examining the detailed description of completely nonlimiting embodiments and the appended drawings, in which:

FIG. 5 is a sectional view of a standard integrated cell;

FIG. 6 shows a variant of the FIG. 5 standard integrated cell;

FIG. 8 is a schematic view of an electronic device which incorporates a standard integrated cell.

DETAILED DESCRIPTION

Figure 1:
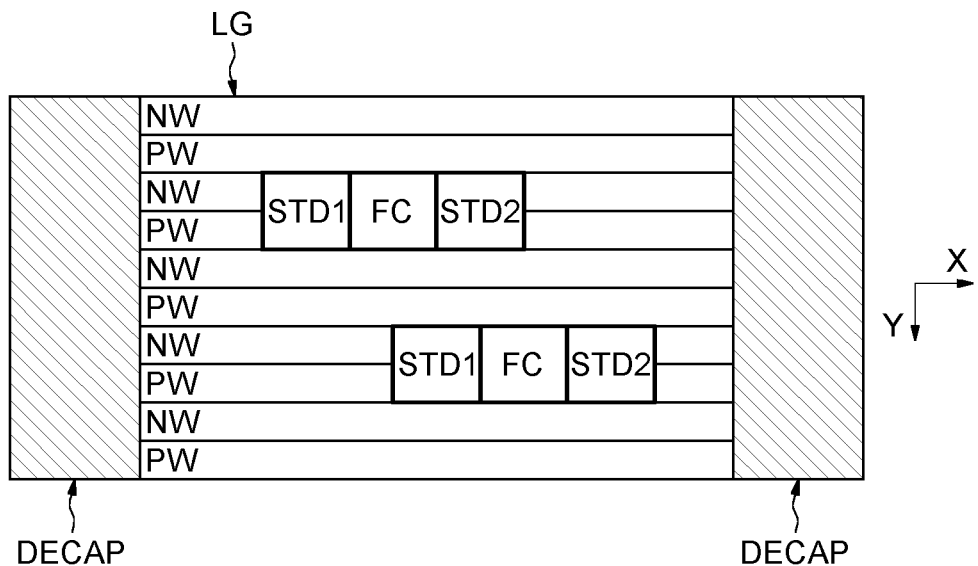
FIG. 1, described above, schematically illustrates a logic part of an integrated circuit comprising conventional decoupling capacitors and conventional standard cells.
Figure 2:
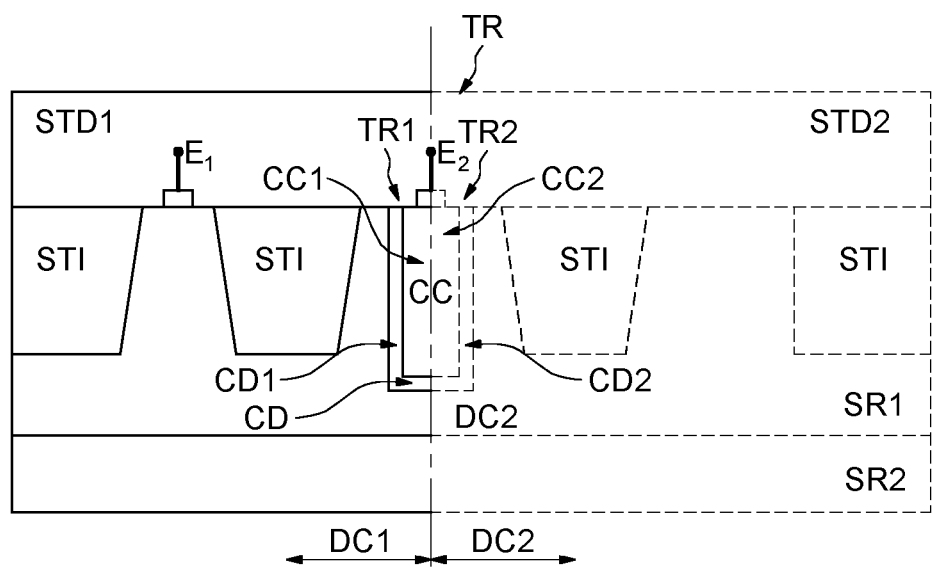
FIG. 2 is a sectional view of one example of a pair of standard integrated cells.

FIG. 2 shows a sectional view of one example of a first standard integrated cell STD1 and of a second standard integrated cell STD2.

Each standard cell STD1, STD2 includes at least one respective domain, referred to as the continuity domain DC1, DC2, which is intended to be adjacent to the continuity domain of the other standard cell.

In a standard cell, a continuity domain DC1, DC2 is, for example, located at the ends of this standard cell.

The continuity domain is intended to form the junction between two standard cells.

The standard cells may include, for example, logic functions performed using complementary technology (CMOS).

The continuity domain makes it possible to provide continuity, at the level of the power supply rails and interconnection metal tracks, of an assembly of standard cells for the purpose of producing, for example, combinations of the logic functions of said standard cells.

The standard cells STD1, STD2 comprise insulating regions STI, for example shallow trench isolations, or a local oxide (LOCOS, short for "local oxidation of silicon").

A standard cell generally includes an n-type well and a p-type well.

The two standard cells comprise two respective capacitive elements TR1, TR2.

In this example, the continuity domains DC1, DC2 each comprise one available space.

The term "available space" is understood here to mean, for example, a space which, in a standard cell having a completed functional architecture, is capable of accommodating at least one capacitive element, without changing or negatively affecting said function of the standard cell.

As described in detail below, the semiconductor properties of this available space are advantageously used, without compromising said function of the standard cell.

The continuity domains DC1, DC2 together form the junction between the neighboring standard cells STD1, STD2.

The first standard cell STD1 comprises a first trench portion TR1, here half a trench.

The first trench portion TR1 comprises a first electrically conductive region CC1 and a first dielectric wall CD1 separating said first electrically conductive region CC1 on the bottom and one side of the first region CC1.

The side of the first electrically conductive region CC1 covered by said dielectric wall CD1 is the side located on the inside of the first standard cell STD1.

Symmetrically, the second standard cell STD2 comprises a second trench portion TR2, here half a trench.

The second trench portion comprises a second electrically conductive region CC2 and a second dielectric wall CD2 separating said second electrically conductive region CC2 on the bottom and one side of this same second region CC2.

The side of the second electrically conductive region CC2 covered by said dielectric wall CD2 is the side located on the inside of the second standard cell STD2.

Together, the two trench portions TR1, TR2 thus form a complete capacitive trench TR.

The complete capacitive trench TR is located at the junction of the continuity domains DC1, DC2.

The complete capacitive trench TR houses an electrically conductive central portion CC enveloped in a dielectric wall CD.

The complete capacitive trench is formed in the semiconductor regions SR1 of each standard cell.

Thus, the well SR1 forms a first electrode E1 of the capacitive element.

The electrically conductive central portion CC forms a second electrode E2 of the capacitive element.

In practice, the complete trench TR is formed during the production of a logic part by joining two trench portions together, each trench portion belonging to the continuity domain of adjacent standard cells.

The first electrically conductive region and the second electrically conductive region CC1, CC2 together form a complete conductive region CC.

The first dielectric wall and the second dielectric wall CD1, CD2 together form a complete dielectric wall CD.

The complete dielectric wall CD envelops the complete conductive region CC on the bottom and the sides.

A first substrate contact in the well SR1 forms a connection for the first electrode E1 of the capacitive element.

A second contact in the electrically conductive central portion CC of the unitary trench TR forms a connection for the second electrode E2 of the capacitive element.

Figure 3:
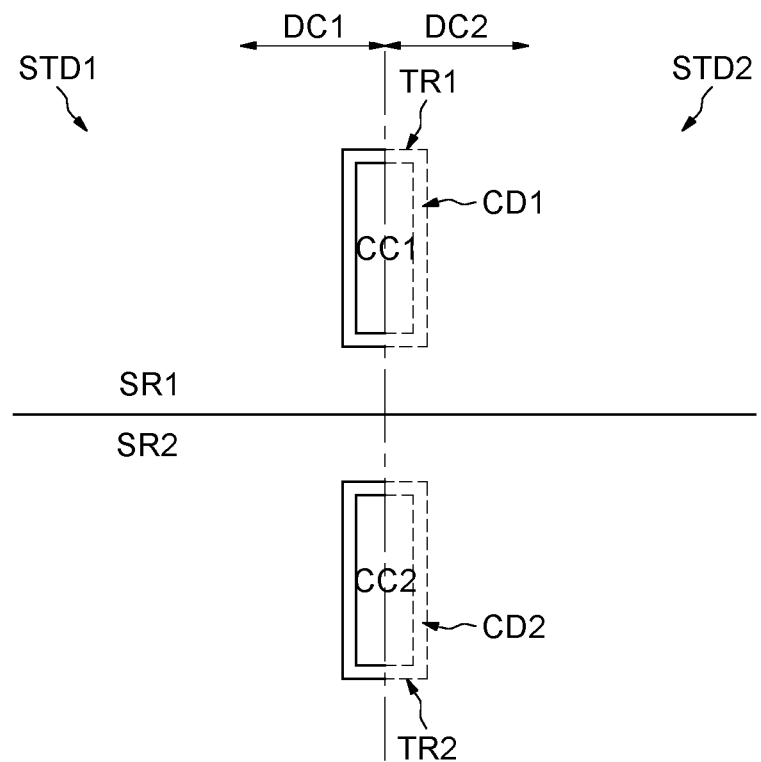
FIG. 3 is a view from above of the pair of standard integrated cells in FIG. 2.

FIG. 3 shows a view from above of two standard cells STD1, STD2.

Each standard cell STD1, STD2 generally includes an n-type well SR1 and a p-type well SR2, which is formed by the substrate.

The two cells STD1 and STD2 together include two capacitive elements TR1, TR2 at the level of the continuity domains DC1 and DC2.

In a manner analogous to the example described above with reference to FIG. 2, a capacitive element TRi includes a capacitive trench comprising a conductive region CCi and a dielectric wall CDi enveloping said conductive region CCi.

The n-type well SR1 forms a first electrode (E1) of the capacitive element TR1, which electrode is for example intended to be coupled to a supply voltage.

The conductive region CC1 filling the trench TR1 forms a second electrode (E2) of this capacitive element, which electrode is for example intended to be coupled to ground.

The p-type well SR2 forms a second electrode (E2) of the capacitive element TR2, which electrode is for example intended to be coupled to ground.

The conductive region CC2 filling the trench TR2 forms a first electrode (E1) of this capacitive element, which electrode is for example intended to be coupled to a supply voltage.

Figure 4:
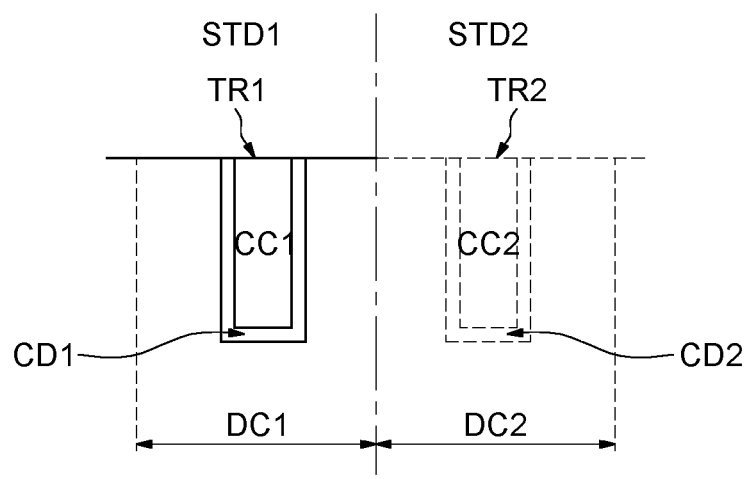
FIG. 4 is a sectional view of another example of a pair of standard integrated cells.

FIG. 4 shows a sectional view of another example of a first standard cell STD1 and of a second standard cell STD2.

Each standard cell STD1, STD2 includes at least one domain, referred to as the respective continuity domain DC1, DC2, which is intended to be adjacent to the continuity domain of the other standard cell.

In a manner analogous to the continuity domains of the standard cells described above with reference to FIG. 2, the continuity domains DC1, DC2 together form the junction between the neighboring standard cells STD1, STD2.

In this embodiment, each continuity domain includes a complete capacitive trench TRi including a complete conductive region CCi and a complete dielectric wall CDi enveloping said conductive region.

Of course, if the available space allows it, more than one trench may be produced in the continuity domain.

The first standard cell STD1 thus comprises at least one trench TR1 comprising a first electrically conductive region CC1 enveloped by a first dielectric wall CD1.

The trench TR1 is formed in a semiconductor region located in the continuity domain DC1 of said standard cell STD1.

The second standard cell STD2 thus comprises at least one trench TR2 comprising a first electrically conductive region CC2 enveloped by a first dielectric wall CD2.

The trench TR2 is formed in a semiconductor region located in the continuity domain DC2 of said standard cell STD2.

FIG. 5 shows a sectional view of another example of a standard cell STD5.

A capacitive element or capacitive trench TR surrounds said substrate region RSub of the transistor TRR, and makes contact with the insulating regions STI.

Said trench surrounds the transistor TRR on all sides.

FIG. 6 shows one variant of the example described above with reference to FIG. 5, the common elements of which bear the same references and will not be described in detail again here.

The capacitive trench TR surrounds the substrate region RSub of the transistor TRR, and is located at a distance from the insulating regions STI.

Figure 7:
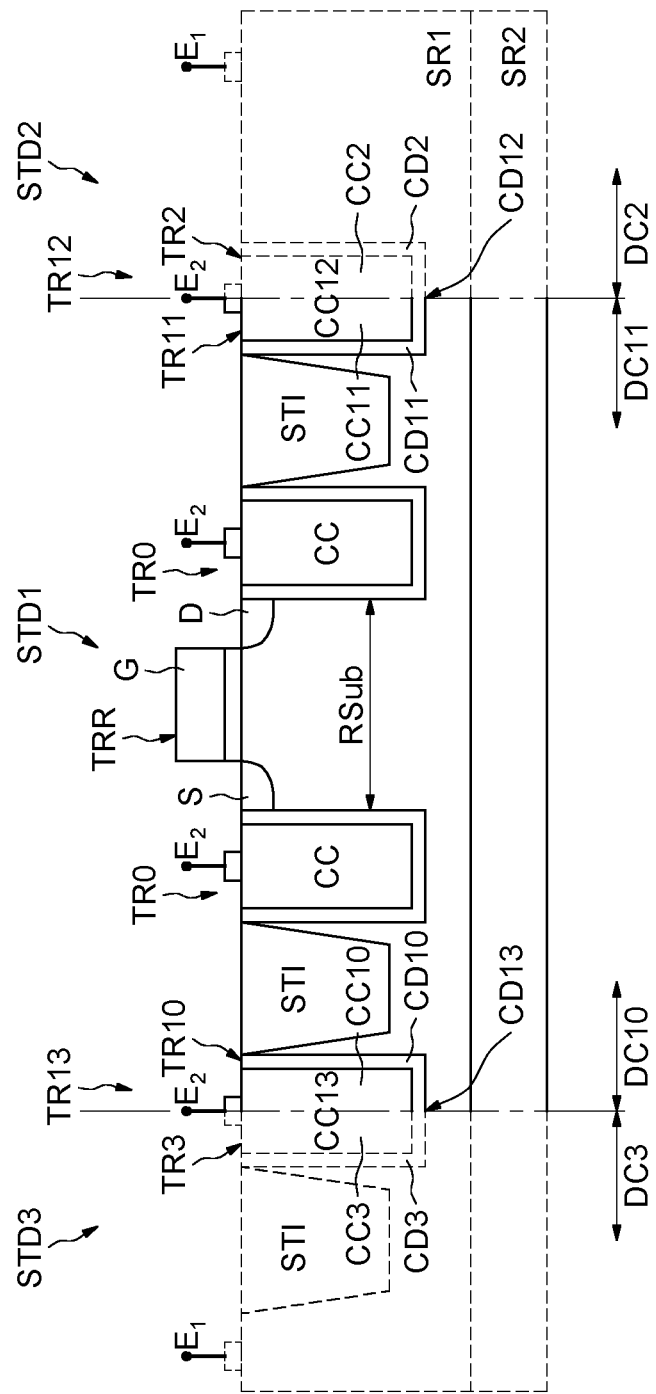
FIG. 7 is a sectional view of an exemplary assembly of three standard integrated cells.

FIG. 7 shows a sectional view of an exemplary assembly of three standard cells STD1, STD2 and STD3 combining the exemplary embodiments described above with reference to FIGS. 2 and 5, the common elements of which bear the same references and will not be described in detail again here.

A first standard cell STD1 comprises a first capacitive trench portion TR10 housed in a continuity domain DC10, a second capacitive trench portion TR11 housed in a continuity domain DC11 and a capacitive element TR0 housed around a substrate region of a transistor TRR.

A second standard cell STD2 comprises a capacitive trench portion TR2 housed in a continuity domain DC2, in contact with the capacitive trench portion TR11.

A third standard cell STD3 comprises a capacitive trench portion TR3 housed in a continuity domain DC3, in contact with the capacitive trench portion TR10.

The capacitive trench portions TR11, TR2 form a complete capacitive trench TR12.

The capacitive trench portions TR10, TR3 form a complete capacitive trench TR13.

FIG. 8 shows an electronic device APP, such as a mobile telephone, an on-board computer of a vehicle or any other known device, including an integrated circuit CI comprising standard cells according to embodiments described above with reference to FIGS. 2 to 6, or combinations thereof.

A logic part LG of the integrated circuit CI includes a series of semiconductor wells NW having a first type of conductivity, for example n-type conductivity, and of semiconductor wells PW having the opposite type of conductivity, for example p-type conductivity.

The wells NW and PW are arranged in bands traversing the logic part lengthwise (in a direction X), alternating with one another laterally (in a direction Y, perpendicular to the direction X). This makes it possible to produce standard cells in which logic gates produced using a complementary technology (CMOS) are formed.

Decoupling capacitors DECAP, occupying a dedicated space located at the edge of the logic part LG, allow sudden variations in the supply voltage to be filtered out.

Standard cells STD1, STD2, STD3, STD4 are assembled according to the same embodiment described above with reference to FIGS. 2 to 6 or any possible combination of the various embodiments described with reference to FIGS. 2 to 6.

Each standard cell, in addition to its logic function, adds to the overall capacitive value of the decoupling capacitor without increasing the footprint.

The integrated circuit CI furthermore includes other functional parts BL1, BL2, BL3 such as, in one example of a memory integrated circuit CI, a memory plane, a sense amplifier or a data bus interface.

Furthermore, the invention is not limited to these embodiments but encompasses all variants thereof; for example, the various described embodiments may be combined with one another to form any type of arrangement suiting the needs and the possibilities of the architectures.

The invention claimed is:

1. A standard integrated cell, comprising:
   at least one semiconductor region including at least one functional domain containing at least one transistor and at least one continuity domain that is configured to be located adjacent to at least one other continuity domain of at least one other standard integrated cell; and
   at least one capacitive element housed in at least one of: said at least one continuity domain; or around a substrate region of said at least one transistor;
   wherein said at least one capacitive element housed in said at least one continuity domain or around a substrate region of said at least one transistor includes at least one capacitive trench including a vertical conductive region enveloped by a dielectric wall.

2. A standard integrated cell, comprising:
   at least one semiconductor region including at least one functional domain containing at least one transistor and at least one continuity domain that is configured to be located adjacent to at least one other continuity domain of at least one other standard integrated cell; and at least one capacitive element housed in at least one continuity domain, wherein said at least one capacitive element housed in said at least one continuity domain includes a capacitive trench portion that is located on an edge of said continuity domain and which is configured to join with another capacitive element located on the edge of said at least one other continuity domain to form a complete capacitive trench.

3. The standard integrated cell according to claim 2, wherein said capacitive trench portion comprises a vertical conductive region and a dielectric wall separating said vertical conductive region from said at least one semiconductor region on a bottom and on one side of the vertical conductive region.

4. The standard integrated cell according to claim 2, wherein said at least one capacitive element housed in said at least one continuity domain includes at least one capacitive trench including a vertical conductive region enveloped by a dielectric wall.

5. A standard integrated cell, comprising:
at least one semiconductor region including at least one functional domain containing at least one transistor and at least one continuity domain that is configured to be located adjacent to at least one other continuity domain of at least one other standard integrated cell,
wherein said at least one transistor comprises a substrate region delimited by insulating regions, and
at least one capacitive element housed around the substrate region of said at least one transistor, wherein the at least one capacitive element housed around the substrate region surrounds said substrate region at a location within said insulating regions.

6. The standard integrated cell according to claim 5, wherein said at least one capacitive element housed around said substrate region comprises a capacitive trench including a vertical conductive region enveloped by a dielectric wall.

7. The standard integrated cell according to claim 5, wherein said at least one capacitive element is located at a distance from said insulating regions.

8. The standard integrated cell according to claim 5, wherein said at least one capacitive element is located in contact with said insulating regions.

9. An integrated circuit, comprising:
a logic circuit including a plurality of standard integrated cells, wherein at least one standard integrated cell comprises:
at least one semiconductor region including at least one functional domain containing at least one transistor and at least one continuity domain that is configured to be located adjacent to at least one other continuity domain of at least one other standard integrated cell; and
at least one capacitive element housed in said at least one continuity domain, wherein said at least one capacitive element housed in said at least one continuity domain includes a capacitive trench portion that is located on an edge of said continuity domain and which is configured to join with another capacitive element located on the edge of said at least one other continuity domain to form a complete capacitive trench.

10. The integrated circuit according to claim 9, wherein said capacitive trench portion comprises a vertical conductive region and a dielectric wall separating said vertical conductive region from said at least one semiconductor region on a bottom and on one side of the vertical conductive region.

11. The integrated circuit according to claim 9, wherein said at least one capacitive element housed in said at least one continuity domain includes at least one capacitive trench including a vertical conductive region enveloped by a dielectric wall.

12. An electronic device, such as a mobile telephone or a computer, including an integrated circuit according to claim 9.

13. An integrated circuit, comprising:
a logic circuit including a plurality of standard integrated cells, wherein at least one standard integrated cell comprises:
at least one semiconductor region including at least one functional domain containing at least one transistor and at least one continuity domain that is configured to be located adjacent to at least one other continuity domain of at least one other standard integrated cell,
wherein said at least one transistor comprises a substrate region delimited by insulating regions, and
at least one capacitive element housed around a substrate region of said at least one transistor, wherein the at least one capacitive element housed around the substrate region surrounds said substrate region at a location within said insulating regions.

14. The integrated circuit according to claim 13, wherein said at least one capacitive element housed around said substrate region comprises a capacitive trench including a vertical conductive region enveloped by a dielectric wall.

15. The integrated circuit according to claim 13, wherein said at least one capacitive element is located at a distance from said insulating regions.

16. The integrated circuit according to claim 13, wherein said at least one capacitive element is located in contact with said insulating regions.

17. An electronic device, such as a mobile telephone or a computer, including an integrated circuit according to claim 13.

18. A standard integrated cell, comprising:
a semiconductor region including a functional domain with an integrated logic circuit and a continuity domain adjacent the functional domain, wherein the continuity domain is located at an edge of the standard integrated cell, said edge configured to be located adjacent to another standard integrated cell; and
a capacitive element located in said continuity domain; wherein the capacitive element is located at the edge.

19. The standard integrated cell according to claim 18, wherein the capacitive element includes a capacitive trench portion that is located on the edge which is configured to join with another capacitive trench portion located in said another standard integrated cell.

20. The standard integrated cell according to claim 18, wherein said capacitive element comprises:
a trench extending into the semiconductor region; and
a vertical conductive region enveloped by a dielectric wall located within said trench.

21. A standard integrated cell, comprising:
a semiconductor region including a functional domain with an integrated logic circuit including a transistor and a continuity domain adjacent the functional domain, wherein the continuity domain is located at an edge of the standard integrated cell, said edge configured to be located adjacent to another standard integrated cell; and
a capacitive element located in said functional domain and surrounding a substrate region of said transistor.

22. The standard integrated cell according to claim 21, further comprising an insulating region which delimits said substrate region of the transistor.

23. The standard integrated cell according to claim 22, wherein the capacitive element is located inside of said insulating region.

24. The standard integrated cell according to claim 23, wherein the capacitive element is in contact with said insulating region.

25. The standard integrated cell according to claim 21, wherein said capacitive element comprises:
- a trench extending into the semiconductor region; and
- a vertical conductive region enveloped by a dielectric wall located within said trench.

* * * * *